April 4, 1950 D. H. MILLS 2,503,121

TUNING AND PUSH BUTTON CONTROL

Filed Dec. 7, 1945 5 Sheets-Sheet 1

INVENTOR.
Donald H. Mills
BY
Clarence J. Loftus
atty.

April 4, 1950 D. H. MILLS 2,503,121

TUNING AND PUSH BUTTON CONTROL

Filed Dec. 7, 1945 5 Sheets-Sheet 2

INVENTOR.

Donald H. Mills

Clarence J. Loftus
Atty.

April 4, 1950 D. H. MILLS 2,503,121

TUNING AND PUSH BUTTON CONTROL

Filed Dec. 7, 1945 5 Sheets-Sheet 3

INVENTOR.
Donald H. Mills
BY
Clarence J. Loftus
Atty.

April 4, 1950 D. H. MILLS 2,503,121

TUNING AND PUSH BUTTON CONTROL

Filed Dec. 7, 1945 5 Sheets-Sheet 4

INVENTOR.

Donald H. Mills

Clarence J. Loftus

Atty.

TUNING AND PUSH BUTTON CONTROL

Filed Dec. 7, 1945 5 Sheets-Sheet 5

INVENTOR.
Donald H. Mills
BY Clarence J. Loftus
atty.

Patented Apr. 4, 1950 2,503,121

UNITED STATES PATENT OFFICE 2,503,121

TUNING AND PUSH BUTTON CONTROL

Donald H. Mills, Fort Wayne, Ind., assignor to The Magnavox Company, Fort Wayne, Ind., a corporation of Delaware Application December 7, 1945, Serial No. 633,471

9 Claims. (Cl. 74—10.33)

The present invention relates to radio tuning devices and more particularly to a radio tuning device provided with a plurality of push button actuators for moving the tuning device to selected predetermined positions. Heretofore push button actuated tuners of the type moving the tuning element to a predetermined position had the disadvantage of not providing a sufficiently large number of push buttons thus limiting the selection of stations to be received by push button operation. In certain of the push button tuning devices, which generally utilize a variable capacitor or tuning condenser, the tuning device has been subject to displacement after it has been moved to a predetermined position by a push button due to vibration and the like. It, therefore, would be desirable to provide some arrangement whereby the tendency for a tuning device to shift is minimized.

The push button tuners of the type moving an element to a predetermined position have generally been provided with a manual driving control. In order to provide for easy actuation of the push buttons, it has not been possible to provide anything but a relatively low ratio of drive between the manual tuning control and variable tuning device. Any attempt to introduce a relatively high ratio between the tuning control and the tuning device increased difficulty of moving the push buttons to such an extent as to make the arrangement relatively unfeasible. In view of the fact that the forthcoming radio receivers will operate not only in the broadcast band, but also in the high frequency FM band, it is desirable to provide a larger number of push buttons and an extended dial to facilitate the indication in tuning in the higher frequency ranges.

It is an object of my invention to provide, in a manually controlled push button tuning device of the cable driven type, means for affording a relatively high ratio between the tuning control and the shaft of the tuning device, and at the same time, prevent a back pressure load on the movement of the push buttons.

It is a further object to provide in a tuning device means for automatically disconnecting the push buttons upon their initial movement from the tuning control means, thus greatly reducing the pressure required to actuate the push buttons.

It is a further object of the present invention to provide an improved push button tuning device which minimizes the wear on the pointer cable and provides smoother operation of both the push buttons and the manual tuning control.

A still further object of the present invention is to provide an improved push button tuning device having a larger number of push buttons for the same linear dimensions.

A still further object of the present invention is to provide an improved tuning device having an extended dial scale provided with an inherently light pointer having a smooth travel.

Other and further objects of the present invention subsequently will become apparant by reference to the following description taken in connection with the accompanying drawings wherein Figure 1 is a front view of the tuning device embodying the present invention with portions thereof broken away to show a part of the tuning drive mechanism;

Figure 1:
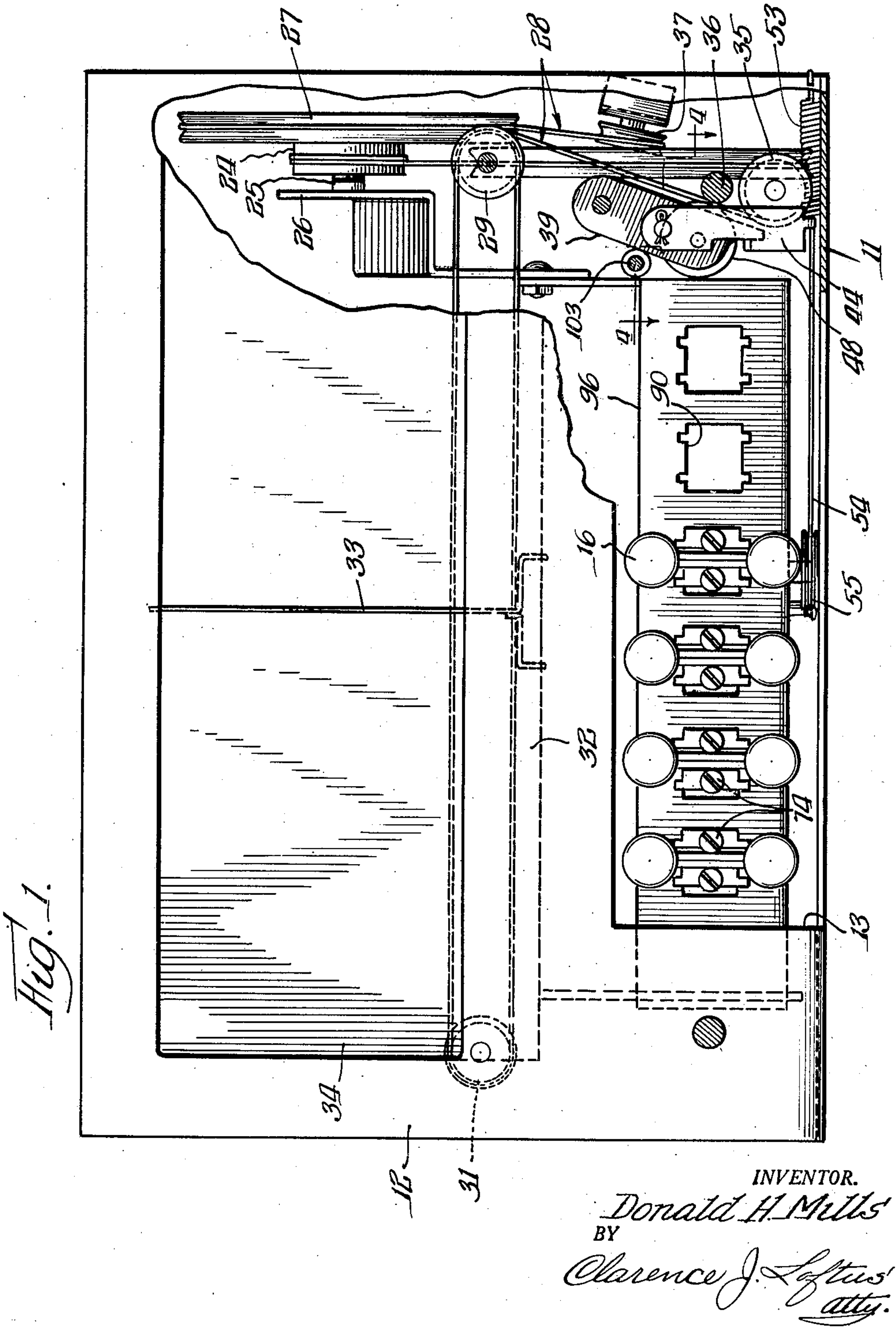

Referring to the drawings there is shown in Figure 1 the mounting base 11 of a radio chassis having a vertically extending upright panel portion 12. The front panel portion 12 has an aperture 13 through which a plurality of push button and push button levers extend. The front of the panel may be provided with control nobs such as the manual tuning control knob 14 and a volume control knob 15. A plurality of push buttons 16 arranged in two horizontal rows with pairs of push buttons aligned vertically extend forwardly of the upright panel 12.

Mounted upon the base 11 of the radio receiver chassis is a variable tuning condenser or capacitor 17 having a plurality of stators 18 and a plurality of rotors 19. The rotors 19 are mounted on a common shaft 21 and are secured to a wheel or pulley 22. The wheel or pulley 22 is provided with a cable 23 which is passed around a smaller pulley 24. The smaller pulley 24 is supported from a shaft 25 carried by a bracket 26 secured to one end plate of the gang condenser 17. The shaft 25 also carries a pulley 27 which is engage by a cable 28. The cable 28 passes over two pulleys 29 and 31 mounted on the back side of the upright panel 12 so that the cable moves horizontally in the proximity of a guide rail 32 having a pointer 33 which cooperates with the longitudinal tuning dial 34. After passing over the pulleys 29 and 31 the cable 28 passes over a pulley 35 mounted on the front panel 12 so that the cable is contiguous to a portion of the manual tuning control shaft 36. The cable 28 after leaving the pulley 35 passes over an adler pulley 37 and back to the wheel 27.

Figures 6, 7:
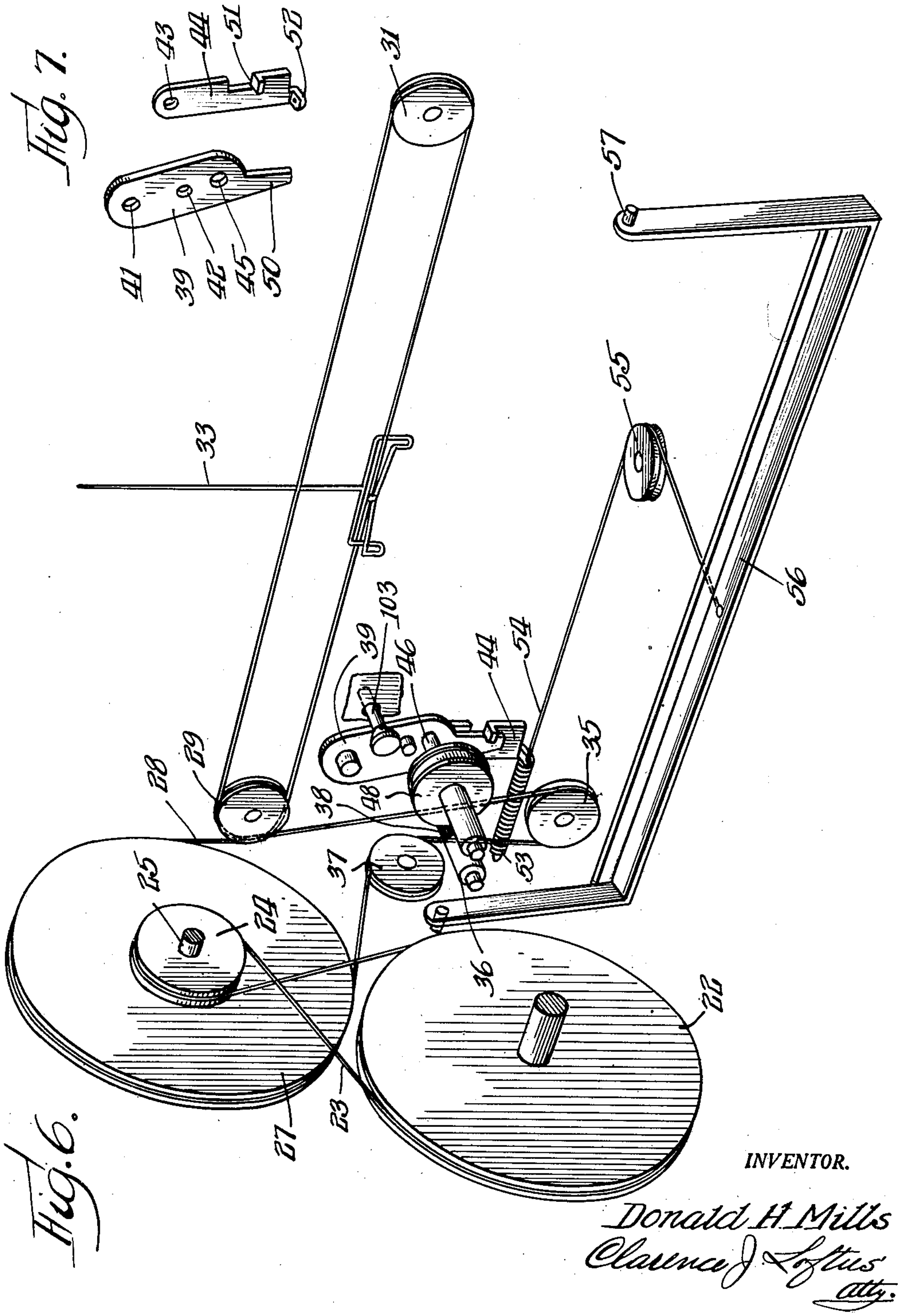
Figure 6 is a perspective view of the treadle bar of the tuning device and the various cables and pulleys of the manual tuning control and the dial indicator.
Figure 7 is a perspective view of the manual tuning control disengaging levers.
Figures 8, 9, 10:
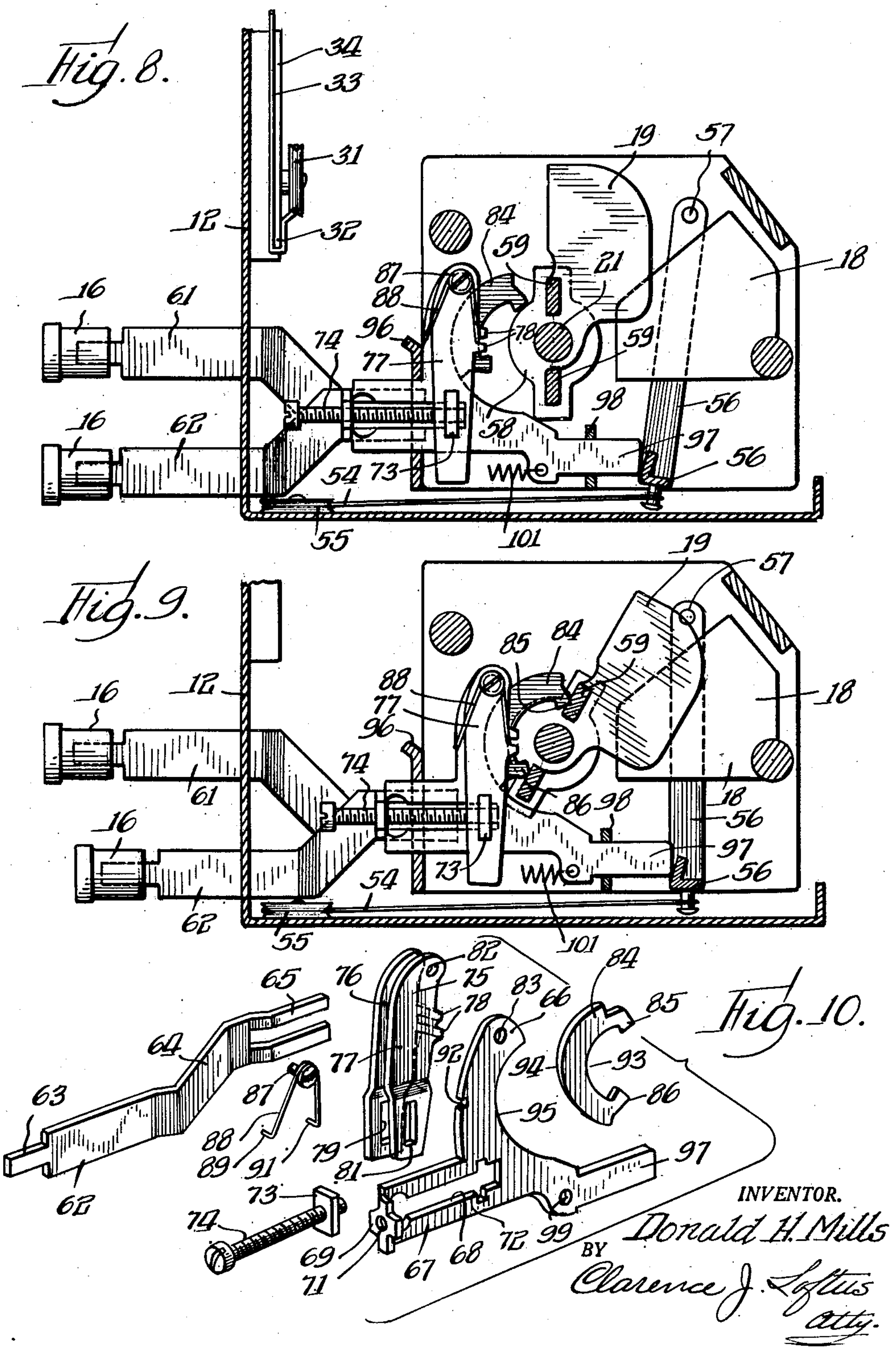
Figure 8 is a right end view as seen in the direction of the arrows along the line 8—8 of Figure 2.
Figure 9 is a view similar to that shown in Figure 8 illustrating the operation of one of the push buttons.
Figure 10 is an exploded view of the elements comprising a single push button actuator.

The cable arrangement described is also illustrated in perspective in Figure 6. By referring to Figure 6 and also Figures 3, 4, and 5 it will be seen that the cable 28 as it passes the manual tuning control shaft 36 is adapted to be contiguous to a roller portion 38 which may be formed on the shaft 36. Preferably the roller portion 38 is of a material which will provide a high coefficient of friction between the roller 38 and the cable 28. Such roller for example may comprise a rubber sleeve securely bonded to the shaft 36.

Mounted on the front panel 12 is a lever 39 which is shown with greater particularity in Figure 7. The lever 39 adjacent the top is provided with an aperture 41 whereby the lever may be pivotally mounted on the panel 12. At an intermediate point the lever 39 is provided with an aperture 42 which is adapted to receive a pin or stud arranged to pass through an aperture 43 in another lever 44. The lever 39 adjacent its lower extremity is provided with an aperture 45 which is adapted to serve as a journal for one end of a shaft 46. The other end of the shaft 46 is mounted in a bracket 47. The shaft 46 at an intermediate point is provided with an idler wheel or roller 48 having a sufficiently high coefficient of friction, and side flanges 49 to cause it to cooperate firmly with roller 38 and cable 28 at its side flanges 49 which engage the roller 38 as may be seen from Figure 4.

Figure 2:
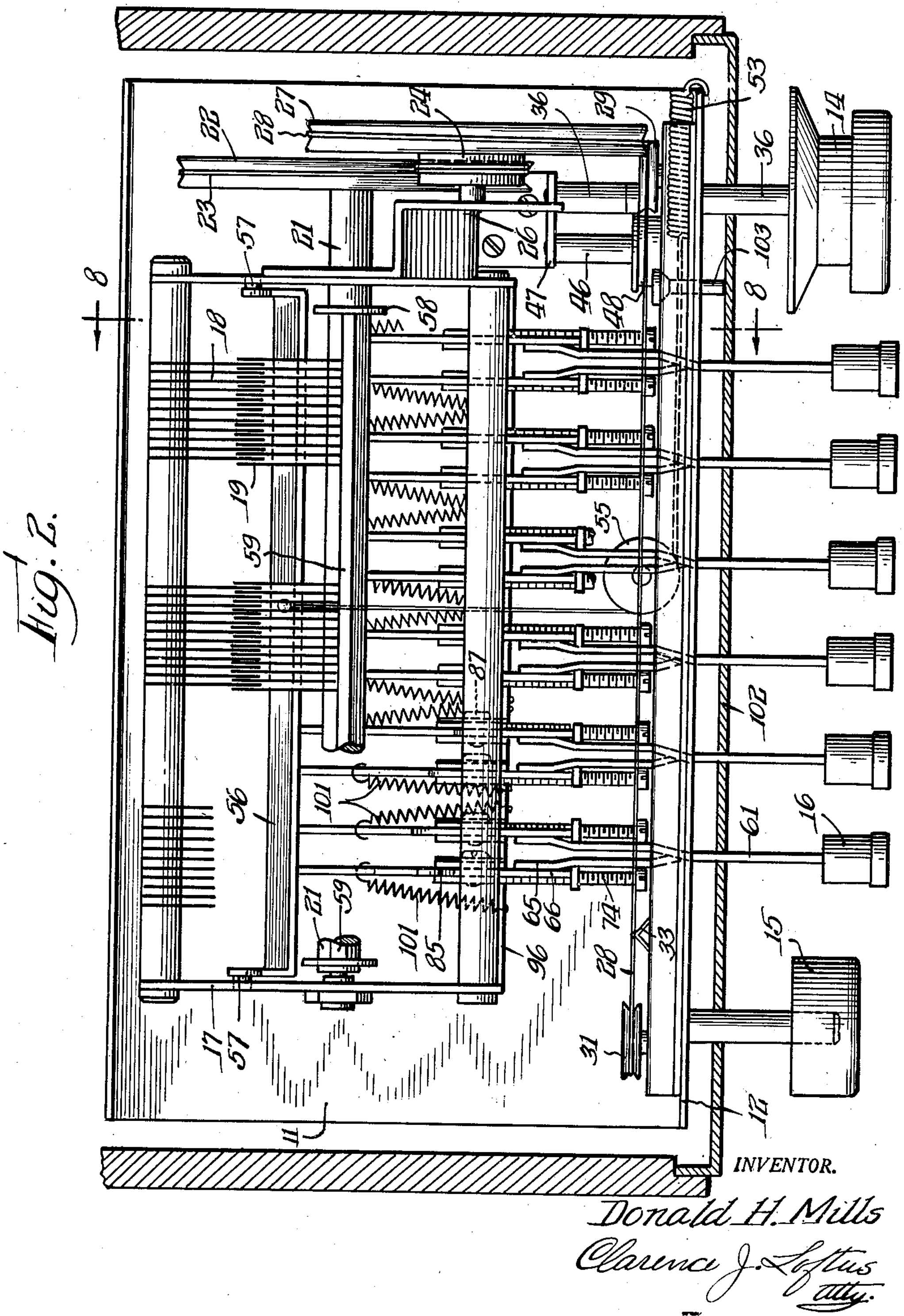
Figure 2 is a plan view of a tuning device shown in Figure 1.

The lever 39 has a lower depending extremity 50 which is adapted to be engaged by a rearwardly extending projection 51 formed on the lever 44. The lever 44 is pivotally secured to the lever 39 in such manner as to provide a certain degree of friction therebetween. The lever 44 at its lower extremity is provided with a projection 52 which is adapted to be engaged by a spring 53 and a cable or cord 54. One extremity of the spring 53 as may be seen from Figure 1 is secured to either the chassis base 11 or the edge of the front panel 12. The cord or cable 54 passes over a pulley 55 secured to the base 11 as may be seen from Figure 2 whereupon the cable or cord continues on to a treadle bar 56. The treadle bar 56 is provided with pivotal supports 57 suitably journalled in the end plates of the variable tuning device or condenser 17. The spring 53 which engages the projection 52 of the lever 44 causes the forward projection 51 of that lever to engage the depending projection 50 of the lever 39 so that normally the idler wheel 48 is in engagement with the roller 38 and the cable 28 as is seen from Figure 4.

The cable and pulley arrangement interconnecting the shaft 21 of the variable tuning capacitor with the shaft 36 of the manual tuning control provides a relatively high ratio drive between these two shafts. Thus for example a relatively high ratio 16 to 1 may be obtained so as to readily permit minute manual adjustment of the tuning capacitor which is particularly suited for tuning a radio receiver in the higher frequency ranges. Due to the fact that the idler wheel 48 is arranged normally to engage the cable 28, and the flanges 49 are of slightly greater diameter than the body of the wheel 48 there is assured a high degree of frictional contact between the cable 28 and the pulley 38 and the wheel 48.

Reference may now be had to Figures 1, 2, and 8 to 10, which illustrate the push button mechanism for moving the condenser rotor to predetermined selected positions. The condenser shaft 21 carries a plurality of plate members 58 which support a pair of cam follower members or bars 59 adapted to be engaged by any one of a plurality of cam members carried by the levers connected to the push button 16. As was previously stated the push buttons 16 are arranged in two horizontal rows with pairs of push buttons aligned vertically. This arrangement is more particularly illustrated in Figures 8 and 9 wherein the upper and lower push buttons 16 are connected to actuating members 61 and 62. The members 61 and 62 are of similar shape and are reversed in position for the upper and lower positions 16. Each of the members 61 and 62 therefore is connected to a similar push button tuning mechanism shown in the exploded view of Figure 10. The forward portion of the member 62 is provided with a reduced end portion 63 upon which a lower push button 16 may be frictionally secured. The member 62 has an intermediate upwardly bent portion 64 which is connected to a terminating bifurcated portion 65. The bifurcated portion 65 is adapted to be spot welded to a cam supporting member 66. The cam supporting member has a forwardly extending portion 67 which is provided with a slot 68 and a front portion 69 bearing an aperture 71. The slot 68 has a transversely arranged recess 72 for receiving a nut member 73 secured to a screw 74. The screw 74 is mounted in an aperture 71 of the forwardly extending portion 67 of the cam supporting member 66. The nut member 73 is also engaged by a locking member 75 which is formed in two similar portions 76 and 77 interconnected by a pair of strap members 78. The lower extremities of the portions 76 and 77 are provided with slots or apertures 79 and 81 for receiving the nut member 73. Each of the members 76 and 77 adjacent its upper portion is provided with an aperture 82 adapted to receive a pin which passes through an aperture 83 in the upper portion of the cam supporting member 66. The cam supporting member 66 supports an arcuate cam 84 having two forwardly extending cam surfaces 85 and 86 adapted to engage the two transversely arranged cam bars 59 on opposite sides of the tuning condenser shaft 21. The rivet or pin 87 which passes through the apertures 82 and 83 in the members 66 and 75 also supports a spring 88 having right-angled end portions 89 and 91. The one extremity 89 is adapted to engage a notch 92 on the back side of the member 66, and the other extremity 91 is adapted to be positioned between the connecing bars 78 of the member 75 so as to engage the inner arcuate surface 93 of the cam member 84. The spring 88 therefore serves to retain the cam 84 so that its outer arcuate surface 94 is in contact with the concave arcuate surface 95 of the member 66.

The tuning device of the condenser adjacent its one side is provided with an upwardly extending plate 96 having a plurality of apertures 90 best seen in Figure 1 which receive the forwardly extending portion 67 of the cam supporting members 66. The cam supporting members 66 are each provided with a forwardly extending portion 97 which passes through suitable openings in the transversely arranged bar 98 shown in Figures 8 and 9. The bar 98 extends between the end plates of the condenser slightly in front of the stators 18. Thus the cam actuator mechanisms are arranged for reciprocable motion by being supported by the members 96 and 98. Adjacent the forwardly extending portion 97 of the member 66 there is provided an aperture 99 which is engaged by a spring 101 having its other extremity engaging the upright wall portion 96. The springs 101 therefore bias the push button 16 forwardly so as to return the push button immediately after actuation. The forwardly extending portions 97 of the cam supporting member 66 when actuated engage the treadle 56 which as may be seen from Figure 8 normally is positioned but a very short distance in front of the extremity of each of the members 97. Thus upon the initial portion of the movement of any push button 16, the treadle bar 56 is actuated. This causes the treadle bar to pull on the cable 54 against the action of the spring 53. This moves the lever 44 which frictionally engages the lever 39 so as to displace the wheel 48 to a position shown in Figure 5. This disengages the cable 28 from the roller 38 so that whenever any push button is actuated, the cable 28 does not drive the manual tuning control shaft 36. This provides relatively free actuation of the tuning element and the cable which supports the pointer 33 thereby minimizing the effort required to tune the radio receiver and minimizing the wear on the parts associated with the tuning element. As soon as the push button has moved the rotors of the tuning element to a selected predetermined position the treadle 56 is returned to its former position thus again causing the cable 28 to be engaged by the wheel 48 and the rollers 38. Since there is such a high gear ratio between the movement of the pulley 48, the roller 38 and the cable 28, this provides a force which resists any movement of the tuning element from its predetermined position due to such forces as for example vibration.

Figures 3, 4, 5:
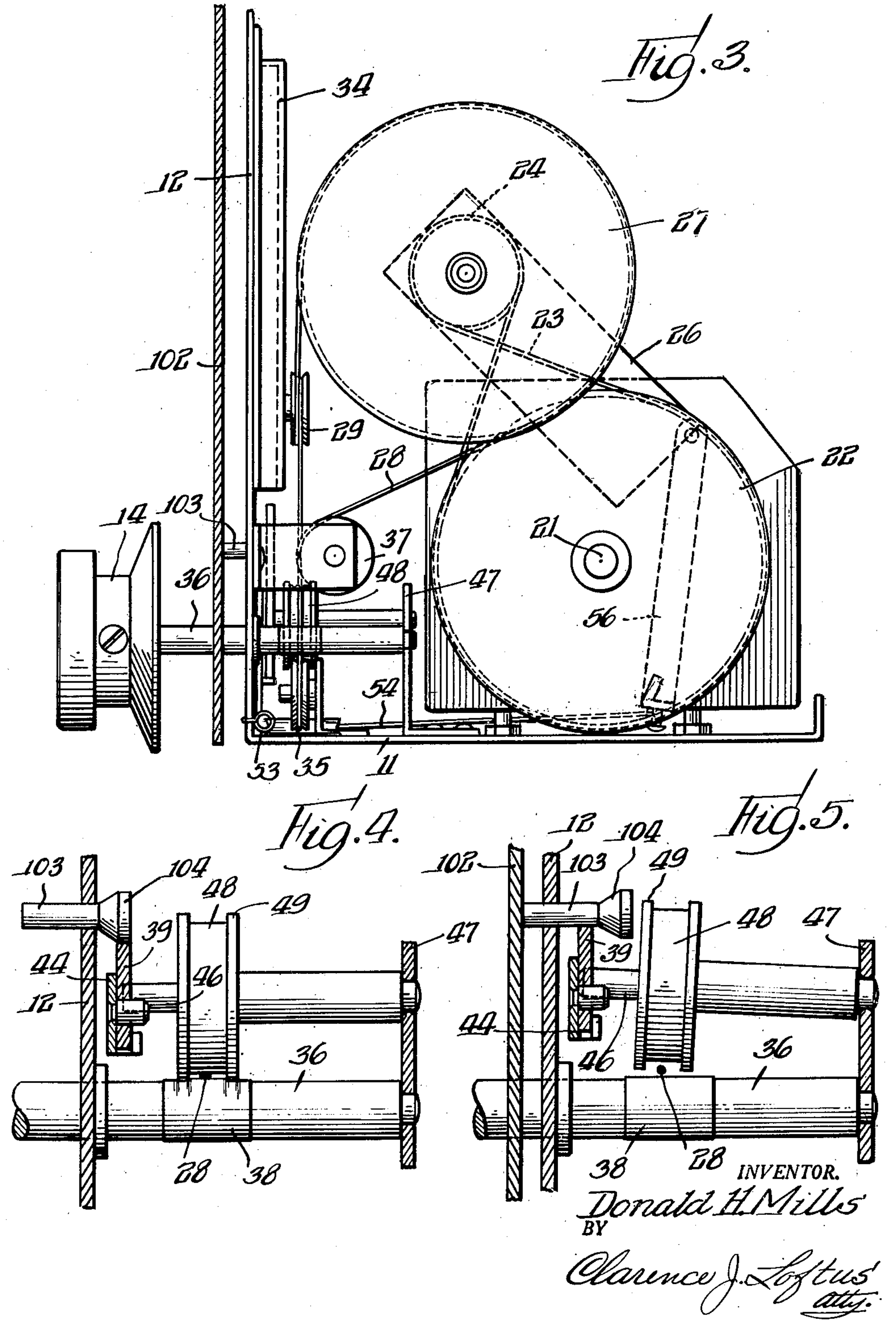
Figure 3 is a right end view of the tuning device shown in Figures 1 and 2.
Figure 4 is a top view showing certain details of the tuning drive mechanism associated with the manual tuning control.
Figure 5 is another view similar to Figure 4 illustrating another position or condition of operation.

In order to preset each of the push button actuators, there is removed from the front of the radio set an escutcheon 102 shown in cross section in Figure 5. Removal of the escutcheon 102 makes accessible the rod 103 which carries an enlarged head cam surface 104 on the inner side of the panel 12. The head 104 when withdrawn as shown in Figure 4 engages one side of the lever 39 so that when the treadle bar 56 is actuated, the lever 44 may move without moving the lever 39 thus maintaining in engagement the wheel 48 with the roller 38 and the cable 28. With the escutcheon removed, the screw 74 is loosened and the pointer of the radio receiver dial is moved to the desired radio station. When the radio receiver has thus been tuned, the manual control is retained in position manually and the push button is moved inwardly so that the bars 59 engage the loosened cam 84 thus moving the cam to its new position. After the cam 84 has been moved to the new position the screw 74 is tightened so as to force rearwardly the member 75 to lock the cam in position. Thereafter actuation of that push button mechanism will move the tuning condenser to a predetermined position.

In order that there be no possibility of locking in position the wheel 48 after the various push button levers have been adjusted, the escutcheon 102 is replaced thus moving inwardly the shaft 103 so that the head 104 no longer is in position to engage the lever 39.

Whenever a push button 16 is actuated the first action to take place is the movement of the treadle 56. The treadle 56 acts to pull the cable or cord 54 which is attached to the lower extremity of the lever 44. Sufficient friction is provided between the lever 44 and the lever 39 to lift the wheel 48 away from the roller 38. This action occurs during the first one-sixteenth inch of travel of the push button 16. Further travel of the push button 16 causes further movement of the treadle 56 which thereafter merely moves the lever 44 without any substantial movement of the lever 39.

The cams 85 and 86 engage the cam bars 59 secured to the rotor of the tuning element to move the rotor to a selected predetermined position corresponding to the radio station to which the receiver is to be tuned. When the push button 16 is released the spring 53 draws the treadle back and also moves the lever 44 until the forward projection 51 engages the extremity 50 of the lever 39 thereafter causing movement of the lever 39 also. This brings the wheel 48 back into engagement with the roller 38 and the cable 28. Due to the high ratio of drive between the manual tuning control shaft 36 and the shaft of the tuning element 17, the manual control acts as a brake to retain the rotor of the tuning element in position against any movement from extraneous causes such as vibration.

The disengagement of the manual tuning control knob during the operation of the push buttons reduces the pressure necessary to actuate the push buttons and also reduces the wear on the cable 28 thus providing over-all smoother operation. The linear dial provides adequate indication spacing which is particularly desirable for tuning the radio receiver in the higher frequency ranges. The arrangement of the longitudinal dial together with the dial pointer provides an arrangement wherein the dial pointer may be inherently light in weight and yet provide accurate indication by virtue of the contact with the pointer guide rail.

As heretofore described it is apparent that it is relatively easy to change the adjustment of any one of the push buttons by removing the escutcheon plate 102 and withdrawing the locking member 103 so as to prevent movement of the lever 39 upon actuation of a push button. The push button locking screw 74 is loosened so that subsequently the cam 84 may be moved to the new position. The desired radio station is tuned in by actuation of the manual control knob 14 which is held fixed by the operator. While the manual control is thus held the push button 16 is merely moved forwardly to orient the cam 84 to its new position. The push button thereupon may be released and the screw 74 tightened. The spring 88 retains the cam 84 in its new position until the screw 74 is tightened, the screw thereupon acting upon the locking members 75 so that the cam 84 will remain fixed irrespective of the force applied to the cam surfaces 85 and 86 when the cam bars 59 are engaged at the time that the rotor is to be moved to the new selected predetermined position.

While for the purpose of illustrating and describing the present invention a preferred embodiment has been shown in the drawings, it is to be understood that such disclosure does not constitute a limitation since such variations in the instrumentalities employed and in their arrangement are contemplated as may be commensurate with the spirit and scope of the invention set forth in the following claims.

This invention is hereby claimed as follows:

1. A radio tuning device having a push button mechanism for moving said device to a selected predetermined position, a manually rotatable tuning control for said device, cable and pulley driving means interconnecting said device with said control to provide a driving ratio greater than one therebetween, and means responsive to the initiation of operation of the push button mechanism for disconnecting said cable driving means from said control.

2. A radio tuning device, a push button mechanism for moving said device to a selected predetermined position, a manual tuning control for said device having a driving roller, cable and pulley means normally interconnecting said device with said roller including means for causing said cable to engage said driving roller, and means actuated by said push button mechanism for disengaging said cable and driving roller.

3. A radio tuning device, a push button mechanism for moving said device to a predetermined position, a manual tuning control for said device having a driving roller, cable and pulley means normally interconnecting said device with said roller including an idler wheel spring biased to cause said cable to engage said driving roller in driving relation thereto, and means actuated by said push button mechanism for moving said idler wheel out of engagement with said cable and driving roller.

4. A radio tuning device, a push button mechanism for moving said device to selected predetermined positions, a manual tuning control for said device having a driving roller, cable and pulley means interconnecting said device with said driving roller to provide a driving ratio greater than one therebetween, an idler roller spring biased to cause said cable to engage said driving roller in driving relation, and means actuated by said push button mechanism for moving said idler roller out of engagement with said cable and driving roller thereby to disengage said cable and pulley means from said driving roller.

5. A radio tuning device, a push button mechanism for moving said device to selected predetermined positions, a manual tuning control for said device having a driving roller, cable and pulley means adapted to interconnect said device with said manual tuning control to provide a driving ratio greater than one therebetween, a shiftable shaft, an idler wheel mounted on said shaft for causing said cable to engage said driving roller, and means responsive to the actuation of said push button mechanism for shifting said shaft to disengage said idler wheel from said cable and driving roller to render ineffective said manual tuning control.

6. A radio tuning device, a push button mechanism for moving said device to selected predetermined positions, a manual tuning control for said device having a driving roller, cable and pulley means adapted to interconnect said device with said manual tuning control to provide a driving ratio greater than one therebetween, an idler wheel for causing said cable to engage said driving roller, said idler wheel being mounted on a shiftable shaft and selectively operable means for maintaining said wheel in engagement with said cable and driving roller while said push button mechanism is actuated.

7. A radio tuning device, a push button mechanism for moving said device to selected predetermined positions, a manual tuning control for said device having a driving roller, cable and pulley means adapted to interconnect said device with said manual tuning control, an idler wheel which causes said cable to engage said driving roller in driving relation thereto, said idler wheel being mounted on a shaft having one end being supported by a fixed member and the other end supported by a pivoted lever, a second lever pivotally connected to said pivoted lever, a spring for biasing said second lever to a predetermined position to cause said first lever to move said idler wheel into engagement with said cable and said driving roller, and means actuated by operation of said push button mechanism for moving said levers against the action of said spring to disengage said cable and driving roller.

8. A radio tuning device, a push button mechanism for moving said device to selected predetermined positions, a manual tuning control for said device having a driving roller, cable and pulley means for interconnecting said device for said manual tuning control including an idler wheel for causing said cable to engage said driving roller, said idler wheel being mounted on a shiftable shaft, a pivoted treadle bar arranged to be actuated by said push button mechanism, a connection between said treadle bar and said shaft for moving said idler wheel against said spring bias out of engagement with said cable and driving roller.

9. A radio tuning device having a plurality of push button actuators for moving a tuning element to selected predetermined positions, a manual tuning control, a horizontal dial having a dial pointer guide rail, a cable arranged to move horizontally along said dial in the proximity of said guide rail, a pointer mounted on said rail and secured to said cable, a pulley for said cable, means connecting said pulley with the moving part of said tuning element, an idler pulley normally biased against said cable and said manual tuning control, a treadle bar arranged to be actuated by any one of said push button actuators, and means interconnecting said treadle bar and said idler pulley for moving said pulley away from said cable and said tuning control.

DONALD H. MILLS.

REFERENCES CITED

The following references are of record in the file of this patent:

UNITED STATES PATENTS

| Number | Name | Date |
|---|---|---|
| 2,153,865 | Gersch | Apr. 11, 1939 |
| 2,267,474 | McGarvey | Dec. 23, 1941 |
| 2,288,098 | Marholz et al. | June 30, 1942 |
| 2,351,443 | Metcalfe et al. | June 13, 1944 |
| 2,372,099 | McGarvey | Mar. 20, 1945 |